TRANSISTOR SWITCHING CIRCUIT HAVING COMPENSATING CIRCUIT

Filed Oct. 20, 1965

INVENTORS
KENJI TANIGUCHI
YUICHIRO OYA

BY Paul M. Craig, Jr.
ATTORNEY

INVENTORS
KENJI TANIGUCHI
YUICHIRO OYA

BY Paul M. Craig, Jr.
ATTORNEY

INVENTORS
KENJI TANIGUCHI
YUICHIRO OYA

BY Paul M. Craig, Jr.
ATTORNEY

INVENTORS
KENJI TANIGUCHI
YUICHIRO OYA

BY Paul M. Craig, Jr.
ATTORNEY

United States Patent Office

3,450,896

Patented June 17, 1969

3,450,896

TRANSISTOR SWITCHING CIRCUIT HAVING COMPENSATING CIRCUIT

Kenji Taniguchi and Yuichiro Oya, Kodaira-shi, Japan, assignors to Hitachi, Ltd., Tokyo, Japan, a corporation of Japan Filed Oct. 20, 1965, Ser. No. 498,319
Claims priority, application Japan, Nov. 21, 1964, 39/65,715
Int. Cl. H03k 19/22, 19/30, 19/08
U.S. Cl. 307—218 3 Claims

ABSTRACT OF THE DISCLOSURE

A transistor logic switching circuit is described having a plurality of switching transistors whose emitters and collectors are connected in common with respective operating voltage sources through a common emitter resistor and a common collector resistor, respectively, and a compensating circuit is provided for detecting the difference voltage across the switching transistors connected in common and for compensating the voltage of the commonly connected collectors to maintain the voltage of the commonly connected collectors within prescribed values.

This invention relates to a novel transistor logic circuit which can widely commonly be used as a basic circuit for high speed, high performance, electronic digital computers.

A trouble usually encountered with the operation of conventional emitter follower logic circuits is that these logic circuits are liable to become oscillatory and tend to lose stable performance when they have a capacitive load therein or when they are connected in cascade fashion. Especially in a high speed operation, these logic circuits have a marked tendency to show unstable performance such as generation of ringing or occurrence of sustained oscillation. Further, the above logic circuit alone can not give an inverted output, and an additional inverting circuit is necessary in order to obtain such inverted output, with the result that circuit configuration inevitably becomes complicated and expensive.

With a view to improve such defects involved in the prior logic circuits, it is an object of the present invention to provide a transistor switching circuit having a plurality of switching transistors whose emitters and collectors are connected in common to respective common terminals each of which is connected to a required power source through a respective common emitter or common collector resistor so as to operate the transistor switching circuit an active state or cut-off state depending on a DC level of an input voltage impressed on the base of said any one of the transistors, characterized in that a compensating circuit is provided to detect a difference between the emitter voltage and the collector voltage of the transistor and to feed back this difference voltage to the collector or other electrode point of the transistor to maintain the emitter to collector voltage of the transistor substantially constant at one end of the DC stationary operating region of the transistor in its active region so that said end of the operating region of the transistor can be set in the neighborhood of the boundary between the saturation region and the active region, whereby to suppress any oscillation at the rise time or fall time portion of pulse response and to attain better stabilization of the performance of the logic circuit.

The above and other objects, advantages and features of the present invention will become apparent from the following description with reference to the accompanying drawings, in which:

FIGS. 1*a* and 1*b* are schematic circuit diagrams showing the basic circuit configuration of conventional logic switching circuits;

Figures 3, 4:
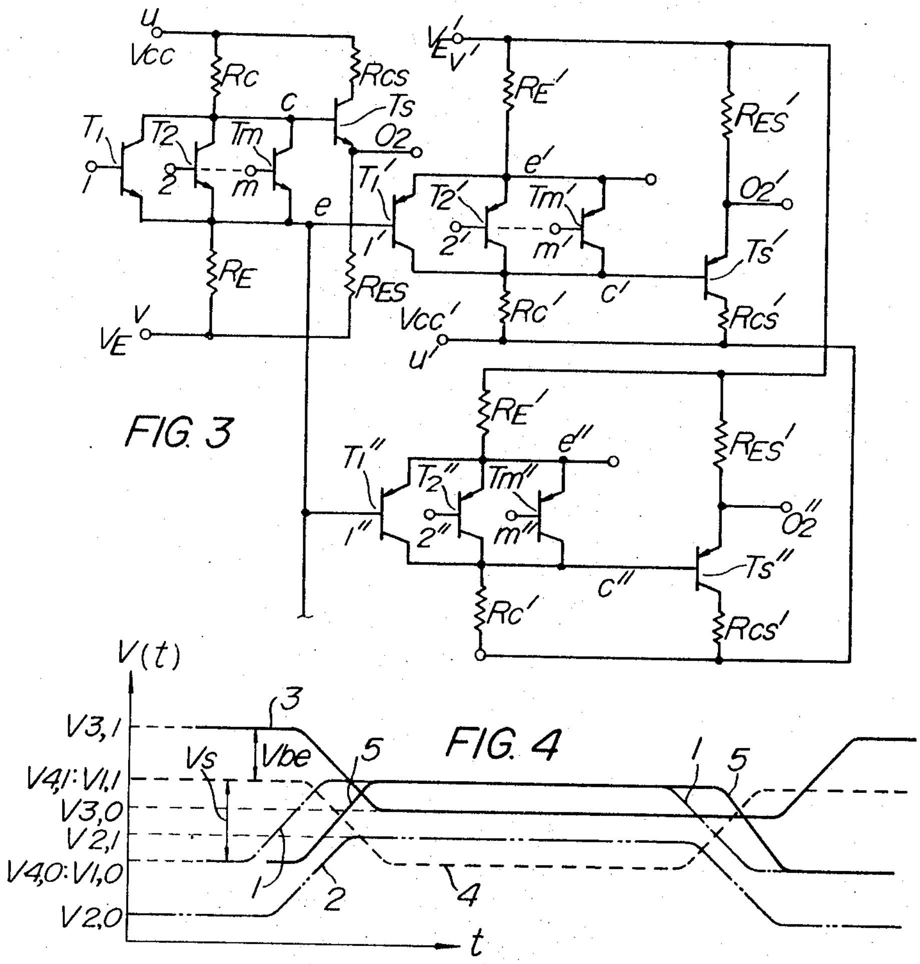
FIG. 3 is a schematic circuit diagram showing a known multi-stage transistor logic switching circuit to which the present invention can be applied.
FIG. 4 is a graphic representation of voltage pulses appearing at various parts of the circuit arrangement shown in FIG. 3.
Figure 6A:
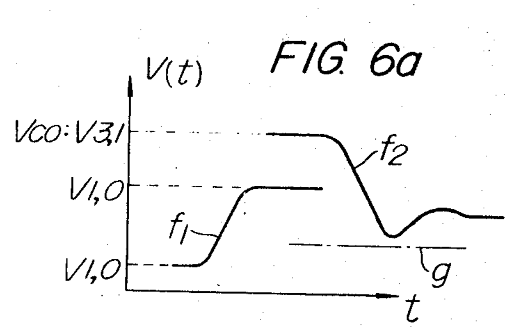
Figure 8:
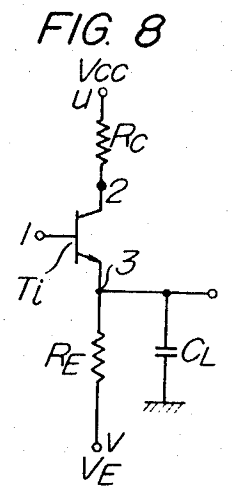
Figure 6B:
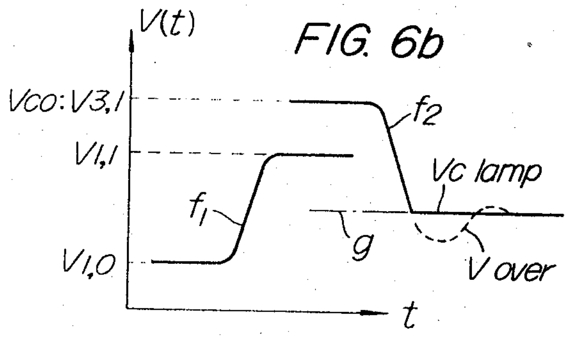
Figure 7:
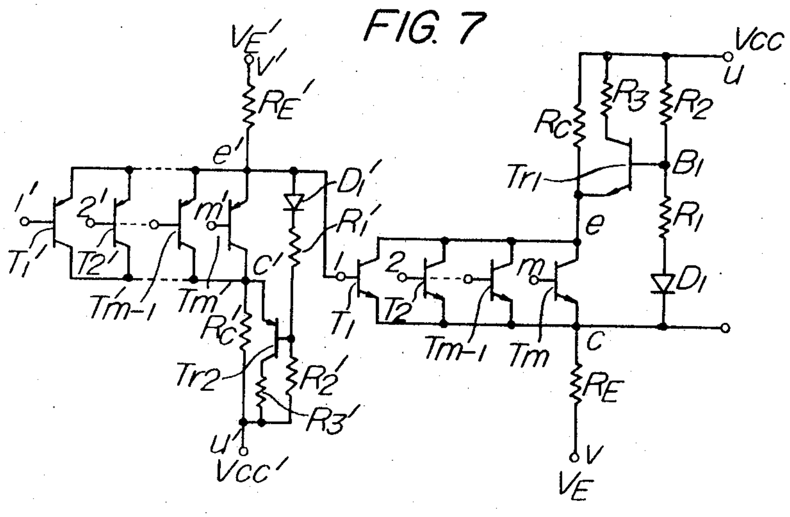
Figures 9, 10, 11, 12:
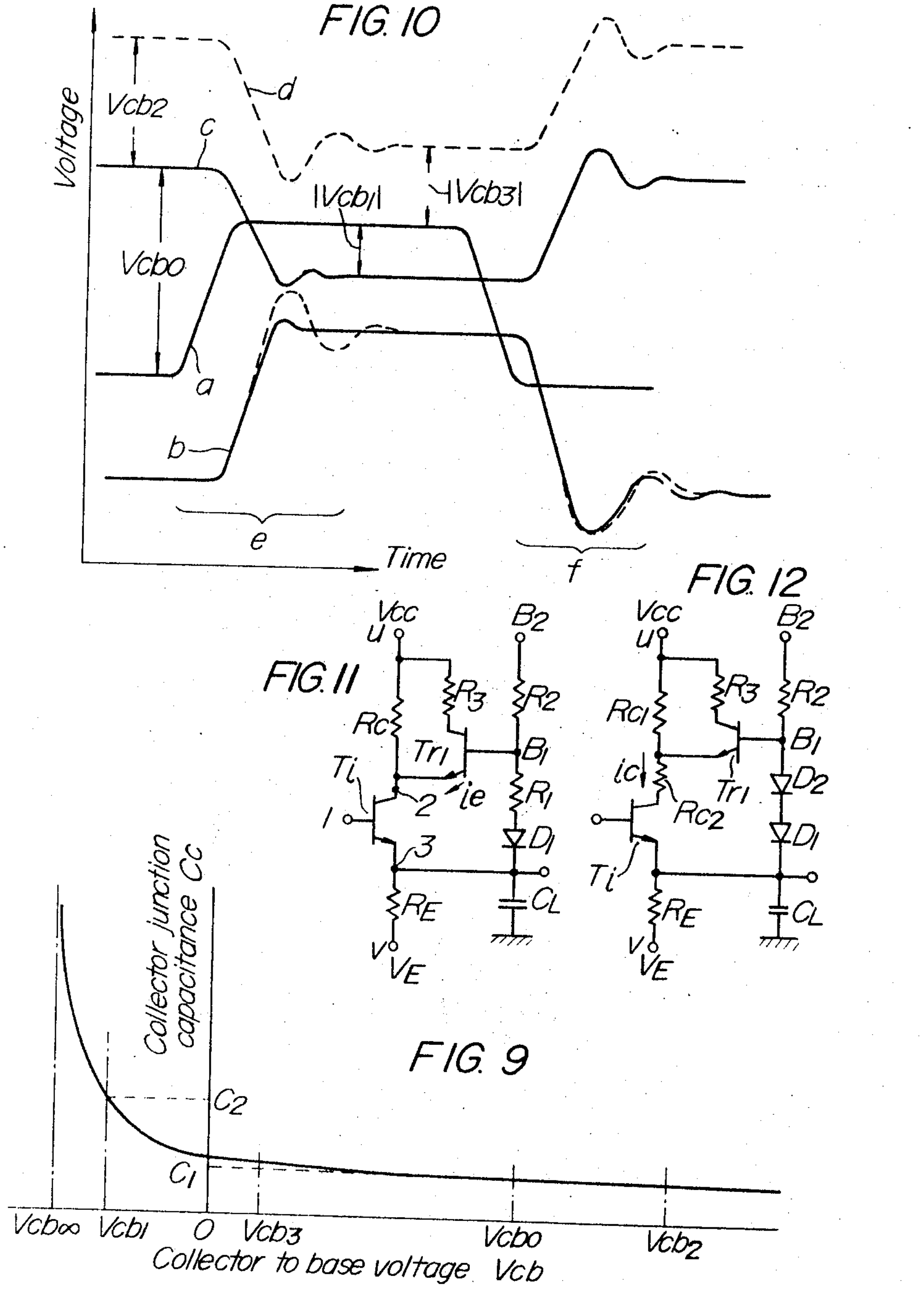

FIG. 6*a* and FIG. 6*b* are each a set of explanatory waveshapes showing the manner of operation of the circuit of FIGURE 3 when it is used for wave shaping;

FIG. 7 is a schematic circuit diagram showing an embodiment of the present invention;

FIG. 8 is a circuit diagram of a prior emitter follower circuit;

FIG. 9 is a graph showing the relation between collector to base voltage and collector junction capacitance of a transistor in the circuit of FIG. 8;

FIG. 10 is an explanatory view showing the manner of operation of the prior circuit shown in FIG. 8; and FIGS. 11 and 12 are schematic diagrams of emitter follower circuits using the present invention.

Figures 1A, 1B:
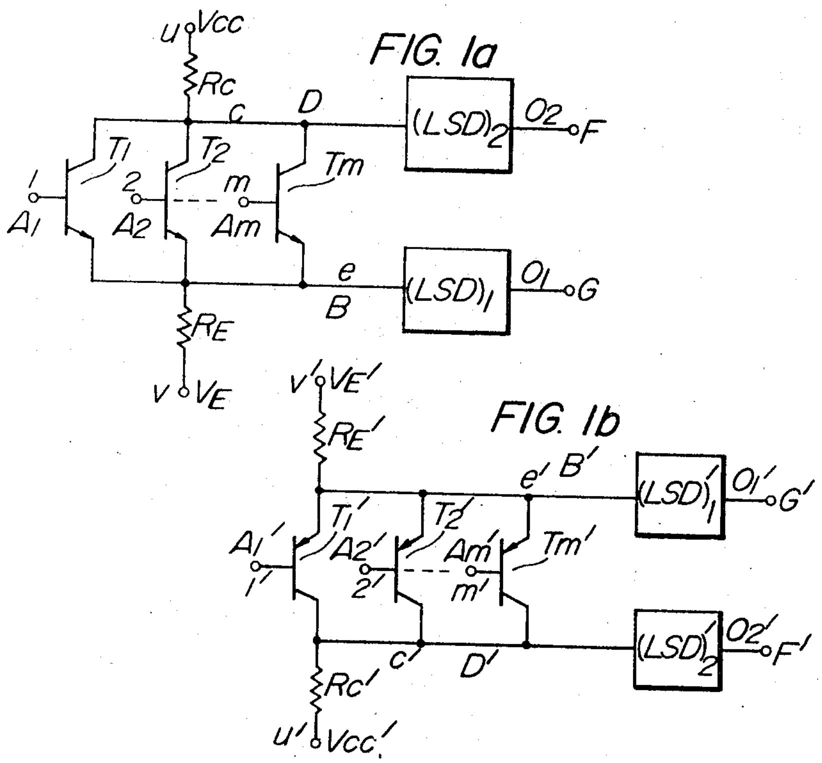

The principle of operation of the circuit according to the present invention will first be described with reference to FIGS. 1 through 6. In FIG. 1*a*, NPN transistors $T_1$, $T_2$, . . ., $T_m$ have their emitters and collectors connected in common to respective common terminals *e* and *c*, which are connected to respective power supplies *v* and *u* through an emitter resistor $R_E$ and a collector resistor $R_C$. In the above arrangement, the resistors $R_E$ and $R_C$ and power supply voltages $V_E$ and $V_{CC}$ are so selected that, when an input voltage is impressed on any one of the bases of the above transistors, these transistors operate in their active or cutoff region instead of their saturation region depending on the DC level of the input voltage. Further, it is assumed here for simplicity of explanation that digital signal voltages impressed on the base input terminals 1, 2, . . ., *m* of the respective transistors take in a DC sense either of two values $V_{1.1}$ and $V_{1.0}$ ($V_{1.1}>V_{1.0}$), and that transistors which have the highest input voltage are solely placed in their active region while the transistors having lower input voltages than the above are in their cutoff region. In other words, when at least one of *m* input voltages has the value $V_{1.1}$, that transistor having the input voltage $V_{1.1}$ is solely in its active region while those transistors having the input voltages $V_{1.0}$ are held in their cutoff region, and when all of the *m* input voltages are $V_{1.0}$, all the transistors are in their active region. By so arranging, voltage or logic circuit output appearing at the common emitter terminal *e* is determined solely by the transistor which is placed in its active region by the highest input voltage.

Suppose now that the so-called positive logic is employed herein in which the logical "1" and the logical "0" are made to correspond to the higher and lower value, respectively, of the respective two voltage values which either the base terminals 1, 2, . . ., *m* or the common terminals *e* and *c* can take respectively.

Assume then that logic symbols $A_1$, $A_2$, . . . , $A_m$ represent the logic inputs to the respective base terminals 1, 2, . . . , *m*, and logic symbols B and D represent that logic outputs at the respective terminals *e* and *c*. The following logical relation can then be derived.

$$B=A_1+A_2+\ . . .\ +A_m \qquad (1)$$

$$D=\overline{A_1+A_2+\ . . .\ +A_m}=\overline{B} \text{ (inverted output of B)} \qquad (2)$$

That is to say, a positive logic sum output is obtained at the terminal *e*, while its inverted output is obtained at the terminal C.

Figure 2:
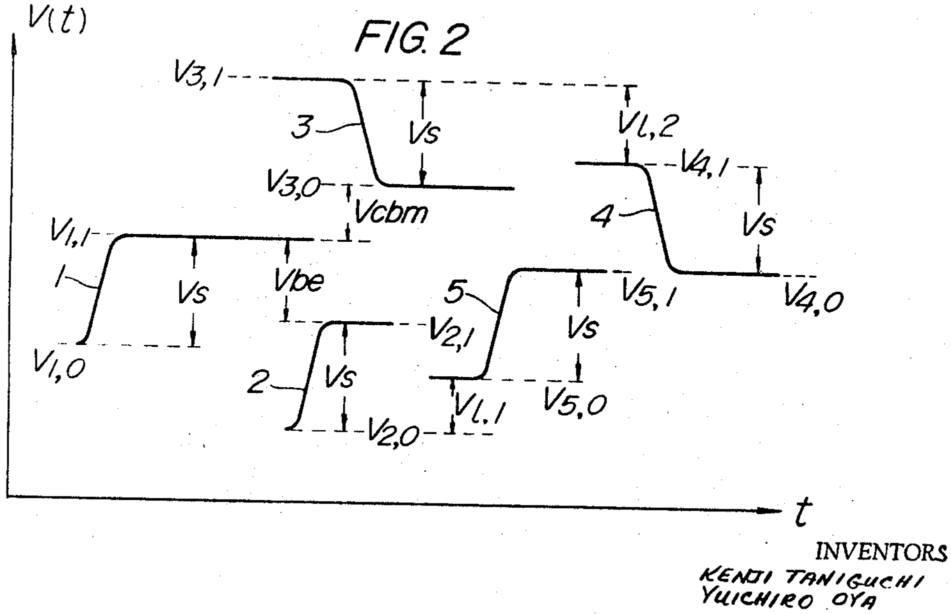
FIG. 2 is a graphic representation of waveforms for the purpose of explaining the principle of operation of the circuit according to the present invention.

FIG. 2 shows a relation between voltage levels at various parts of the circuit of FIG. 1*a*. In FIG. 2, time *t* is taken as abscissa and voltage V(*t*) is taken as ordinate. Pulse waveforms 1, 2, and 3 in FIG. 2 represent input voltage impressed on the respective base input terminals 1, 2, . . . , *m*, output voltage at the terminal *e*, and output voltage at the terminal *c*, respectively. As will be apparent from the above description, respective voltage levels $V_{1.0}$, . . . , $V_{3.0}$ in the above pulse waveforms correspond to the logical "0" and $V_{1.1}$, . . . , $V_{3.1}$ correspond to the logical "1." $V_s$ is the signal voltage swing and $$V_s=V_{1.1}-V_{1.0}$$

It is to be noted that there be a relation $$\frac{\alpha R_C}{R_E}\doteqdot 1$$

in order that the amplitude change of voltage at terminal *c* is equal to the input voltage change. Since commonly $2\alpha\doteqdot 1$ ($\alpha$ is the collector to emitter current amplification factor), $R_C\doteqdot R_E$.

In case the output voltage level at the above terminal *e* or *c* differs from an input voltage level required by a circuit in the succeeding stage connected with the above logic circuit, it is necessary to provide level shift circuits $(LSD)_1$ and $(LSD)_2$ to shift the voltage level at *e* or *c* so that this output voltage level matches the required input voltage level. Pulse waveforms 4 and 5 in FIG. 2 represent the output voltages $O_2$ and $O_1$ from the level shift circuits $(LSD)_2$ and $(LSD)_1$, respectively. In this case again, voltage levels $V_{4.0}$ and $V_{5.0}$ correspond to the logical "0" and voltage levels $V_{4.1}$ and $V_{5.1}$ correspond to the logical "1." $V_{11}$ and $V_{12}$ show the magnitude of voltages shifted by the level shift circuits $(LSD)_1$ and $(LSD)_2$, respectively. $V_{cbm}$ and $V_{be}$ show the minimum value of a difference between the voltage at terminal *c* and the input signal voltage, and a base to emitter voltage drop across the transistor in its conducting state, respectively. The values of the above $V_{11}$ and $V_{12}$ can be obtained from the following equations.

$$V_{11}=V_{5.1}-V_{1.1}+V_{be} \quad (3)$$

$$V_{12}=V_{1.1}-V_{4.1}-V_{cbm}+V_s \quad (4)$$

A circuit diagram shown in FIG. 1*b* is generally similar to that of FIG. 1*a* except that the NPN transistors in the latter circuit are substituted by PNP transistors and dashes are affixed to corresponding smybols. Assume that the above-described positive logic is likewise employed, it will easily be understood that a logical relation as expressed by the following equations consists since the operating mode of a PNP transistor is complementary to that of an NPN transistor.

$$B'=A_1'\cdot A_2'\cdot\ .\ .\ .\ \cdot A_m' \quad (5)$$

$$D'=\overline{B'}=\overline{A_1'\cdot A_2'\cdot\ .\ .\ .\ \cdot A_m'} \quad (6)$$

Thus, a logical product output B' is obtained at a common emitter terminal *e'* and its inverted output D' is obtained at a common collector terminal *c'*. It is a commonly known fact that the above logical relations (5), (6) and (1), (2) will be interchanged when the negative logic is employed instead of the positive logic, that is, when the higher voltage level $V_{1.1}$ is made to correspond to the logical "0" and the lower voltage level $V_{1.0}$ is made to correspond to the logical "1."

Conventional emitter follower logic circuits, as described above, generally are not provided with the collector resistor $R_c$ or $R_c'$ provided in the present invention, and therefore an additional inverting circuit of other kind must be provided in order to obtain an inverted output. In view of such point, it is quite apparent that the circuits according to the present invention which do use such a collector resistor are by far superior to the conventional circuit as described above, and it will be easily known that the flexibility of logical function of the logic circuit can thereby markedly be increased.

Further, by the insertion of the above collector resistor, this resistor and the collector junction capacity of transistor form a negative feedback circuit, which is operative to suppress occurrence of any ringing to thereby improve the stability of performance. This will be explained for example with the circuit of FIG. 1*a*. Even when the output voltage at the terminal *e* becomes too large due to ringing with the result that emitter current, hence, collector current increases, this increase in the collector current causes reduction of the collector voltage due to the presence of the collector resistor $R_c$ and some current thereby flows from the base to the collector through the above-described collector junction capacity. Accordingly the emitter current and voltage are correspondingly reduced and ringing is suppressed.

This effect of ringing suppression becomes more marked with a greater value of collector resistor $R_c$ and a greater value of collector junction capacitance. The collector junction capacitance of a transistor generally changes as a function of collector to base voltage and becomes greater as this voltage approaches the forward biased state of the collector junction, that is, as the operating point of the transistor approaches the saturation region from the active region. By therefore setting one end of the operating region of the transistor at a region in which the collector junction capacitance makes an abrupt increase it is possible to greatly reduce the ringing at this end of the operating region. In the circuit of FIG. 1*a*, for example, voltage at the common collector terminal *c* takes its "0" level and becomes lowest when output voltage at the terminal *e* is at the "1" level in terms of the above-described positive logic. Therefore the collector to base voltage is in its most forward biased state and the effect of ringing suppression at this level becomes extremely great.

There is generally an undesirable tendency that response of the emitter follower is slowed down when the stabilizing effect by the above-described collector resistor and the collector junction capacitance is made greater. However, it is possible to easily eliminate this defect by arranging in a manner that the stabilization as described above may only be effected at the ends of signal swing. Further, in case PNP and NPN transistors are used in a circuit of this type, the operating region of the entire circuit approaches the forward biased state of the NPN transistor at the level "1" and approaches the forward biased state of the PNP transistor at the level "0," and thus it is possible to realize a circuit which is stable at both levels of "1" and "0."

In order to effectively utilize the voltage dependence of collector junction capacitance for the sake of stabilization as described above, it is desirable that collector voltage is at its "0" and "1" levels when emitter voltage is at its "1" and "0" levels, respectively. For this purpose, a common collector terminal may be provided and a resistor may be interposed between this common terminal and a power supply, even though it is not intended to utilize an inverted output derivable from the collector. In this case, a certain degree of stabilizing effect can be expected by separately inserting a resistor in the collector of each transistor in the above-described logic circuit, but it is inevitable that such circuit arrangement becomes defective in that a greater number of resistor elements are required and a less stabilizing effect is obtained compared with the inventive circuit arrangement in which the collectors are connected in common to each other and a single resistor is inserted therein.

An embodiment of a multi-stage transistor logic switching circuit employing the above-described basic circuit configuration is shown in FIG. 3. In FIG. 3, parts denoted by like symbols (including those with two dashes) as used in FIG. 1 operate in an entirely same manner as in the above explanation. $T_s$ is an NPN transistor which forms a part corresponding to the level shift circuit $(LSD)_2$ in FIG. 1*a* and acts to lower the voltage at terminal $O_2$ than the voltage at terminal *c* by an amount corresponding to its base to emitter voltage drop $V_{be}$. The operating mode is that of the emitter follower, and $R_{ES}$ is an emitter resistor. $R_{CS}$ is a resistor which is provided for the purpose of reducing a power consumed by the transistor $T_s$ and stabilizing the performance of this transistor. In some cases, however, this resistor $R_{CS}$ may be eliminated. $T_s'$ and $T_s''$ are PNP transistors which serve as level shifters similar to that described above, and $R_{ES}'$, $R_{ES}''$, $R_{CS}'$ and $R_{CS}''$ are resistors which are used for the purpose similar to that of the above-described resistors $R_{ES}$ and $R_{CS}$.

In the FIGURE 3 circuit, that part which corresponds to the level shift circuit $(LSD)_1$ on the emitter output side as described above is eliminated. More precisely, point *e* on the emitter output side of a logic circuit constituted by NPN transistors $T_1, T_2 \ldots, T_m$ is directly connected to base terminals of transistors $T_1'$ and $T_1''$ of respective logic circuits in the succeeding stage constituted by PNP transistors $T_1', T_2', \ldots, T_m'$ and $T_1'', T_2'', \ldots, T_m''$, and no level shift circuit is interposed therebetween. Though not shown in FIG. 3, points *e'* and *e''* on the emitter output sides of this PNP stage are directly connected to base input terminals of transistors in the next NPN stage and no level shift circuit is interposed therebetween. This is because the output voltage levels at the terminals *e'* and *e''* can be made substantially equal to the base input voltage level for the first stage NPN transistor logic circuit, since the polarity of base to emitter voltage drop $V_{be}$ of the NPN transistors $T_1, T_2, \ldots, T_m$ is opposite to the polarity of base to emitter voltage drop $V_{be}'$ of the PNP transistors $T_1', T_2', \ldots, T_m'$ and $T_1'', T_2'', \ldots, T_m''$, and any shift at DC levels can thereby be almost cancelled. By thus constituting respective logic circuits as described above from transistor sets which are complementary to each other, it is possible to connect these circuits in cascade fashion without using any level shift circuit on the emitter output side.

Further, the inverted output appearing at the terminal $O_2$ whose voltage level is lowered by the amount of $V_{be}$ by means of the level shift transistor $T_s$ can be used as an input into the PNP logic circuit in the succeeding stage or an input into the NPN logic circuit to be connected in the further later stage by a suitable selection of the signal swing $V_s$. Or more precisely, the Equation 4 above described can be written as $$V_s = V_{be} + V_{4.1} + V_{1.1} + V_{cbm} \qquad (7)$$

when $V_{12} = V_{be}$. As $V_{4.1} = V_{2.1}$ when this output is used as an input to the above-described transistors $T_1', T_2', \ldots, T_m'$, and $T_1'', T_2'', \ldots, T_m''$, and since $V_{2.1} = V_{1.1} - V_{be}$ as apparent from FIG. 2, a relation $V_s = -V_{cbm}$ can finally be obtained. A modern transistor, for example, an NPN type silicon epitaxial planar transistor can properly function even when the minimum value $V_{cbm}$ of its collector to base voltage is lowered to a value of the order of $-V_{be}$. Therefore, $V_s$ may be selected in a manner that $V_s \leqq V_{be}$ consists.

Suppose now a case in which the inverted output at said terminal $O_2$ is used as an input signal to the NPN logic circuit to be connected in the further later stage. Then, a relation $V_s = V_{be} - V_{cbm}$ can be obtained from the Equation 7 since $V_{4.1} = V_{1.1}$. In this case, the signal swing may be so selected as to give a relation $V_s \leqq 2V_{be}$ when a transistor which can properly operate in the region $V_{cbm} \geqq -V_{be}$ as described above is used.

FIG. 4 shows a relation between voltage levels of pulses at various parts of the circuit arrangement in FIG. 3, and voltage pulses 1 through 5 therein represent signal waveforms corresponding to like portions in FIG. 2.

The circuit shown in FIG. 3 illustrates a case in which the inverted output is derived from either circuit of NPN and PNP type, but arrangement may be made as required so that one or both of these inverted outputs may be omitted.

Figure 5:
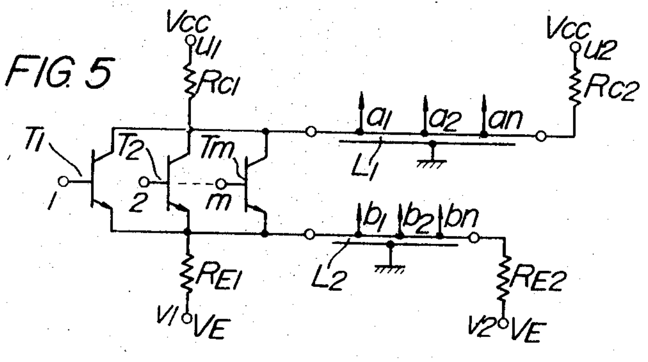
FIG. 5 is a schematic circuit diagram of still another transistor switching circuit arrangement that can be adapted easily for use with the present invention.

In some case, either or both of sets of the power supply voltages $V_E$ and $V_{CC}'$, and $V_{CC}$ and $V_E'$ may be supplied from the same power supply. Further, the collector resistor $R_C$ and the emitter resistor $R_E$, for example, may be divided into respective resistor sections. One form of such arangement is shown in FIG. 5. In the arrangement of FIG. 5, the collector resistor $R_C$ and the emitter resistor $R_E$ are divided into two resistor sections $R_{C1}$, $R_{C2}$ and $R_{E1}$, $R_{E2}$, respectively, and transmission line $L_1$ and $L_2$ are interposed therebetween so that terminals $a_1, a_2, \ldots, a_m$ and $b_1, b_2, \ldots, b_m$ on the respective lines can be connected through the above-described level shift circuits with input terminals in the succeeding stage.

The transistors in the logic circuit described above do not operate in the saturation region in a D.C. sense, but may temporarily be urged to operate in the saturation region in an AC sense. This phenomenon can positively by utilized for the reshaping of the collector voltage waveform. For example, a case of NPN transistors as shown in FIG. 1*a* will be considered with reference to FIG. 6. As shown in FIG. 6*a*, a collector output signal $f_2$ obtained from a base input signal $f_1$ for the transistors $T_1, T_2, \ldots, T_m$ always overlies the saturation boundary *g* and takes the form of an oscillatory pulse as shown when a capacitive load exists at the terminal *e*. However, by suitably determining such factors as the signal swing and collector voltage, part of collector voltage pulse can transiently be made to underlie the saturation boundary as shown in FIG. 6*b*, and thus the portion indicated by $V_{over}$ can be shaped as the portion indicated by $V_{clamp}$. In addition to the above application, the logic circuit described above can be used in combination with a suitable signal regenerator such as a current switching circuit or a saturated inverter.

The next description will be directed to a transistor logic circuit that utilizes certain of the above described features and principles for attaining the object of the present invention.

At first, consider the performance of an NPN transistor T*i*, as shown in FIG. 8, which is one of the logic elements in the above-described logic circuit. It is quite apparent that collector junction capacitance $C_c$ and collector to base voltage $V_{cb}$ of the transistor T*i* have a relation as shown in FIG. 9. It will be seen that the collector junction capacitance $C_c$ becomes smaller as the collector is reverse biased in a successively greater degree, while it becomes greater as the collecter is forward biased in a successively greater degree and finally makes an abrupt increase toward an asymptote as indicated by $V_{cb\infty}$. When now a voltage pulse as shown by a waveform *a* in FIG. 10 is impressed on the base input terminal 1 of this transistor, a voltage pulse as shown by a waveform *b* appears at the emitter output terminal 3 and a voltage pulse having a waveform *c* or *d* appears at the collector terminal 2 depending on a value of the collector supply voltage $V_{cc}$. These collector voltage waveforms *c* and *d* are derived when both ends of the operating region of the collector to base voltage $V_{cb}$ with repsect to the pulse signal are set, for example, at $V_{cbo}$ and $V_{cbl}$, and $V_{cb2}$ and $V_{cb3}$, respectively, where $V_{cbl} < V_{cbo}$ and $V_{cb3} < V_{cb2}$. In the latter case, the emitter voltage waveform *b* has its rise time portion *e* and fall time portion *f* as shown by dotted lines. It will be seen that the effect of ringing suppression at the rise time portion *e* is greater in the former case which is represented by solid lines.

It will thus be known that, by suitably selecting such factors as the collector supply voltage $V_{cc}$ and the collector resistor $R_C$ so that both ends of the operating region are set at the points $V_{cbo}$ and $V_{cbl}$ as shown in FIG. 9, voltage drop across the collector resistor $R_C$ acts to lower the voltage at the emitter terminal 3 to thereby suppress oscillation at the rise time portion of the emitter voltage waveform as described above due to the fact that the collector junction capacitance is abruptly increased in the neighborhood of one end of the operating region with respect to the input pulse signal.

Stable performance at the rise time portion of the emitter voltage waveform can thus be expected, but to do this successfully, it is necessary that the collector to base voltage at the said end of operating region is maintained in a nearly constant region in which the abrupt increase in the collector junction capacitance can be utilized. In the above case, however, voltage $V_e$ at the emitter terminal 3 becomes lower than voltage $V_b$ impressed on the base terminal 1 by an amount of base to emitter voltage drop $V_{be}$ which is nearly constant. Further, emitter current $i_e$ is given by the equation $$i_e = i_L + \frac{V_e - V_E}{R_E} \quad (8)$$

where $i_L$ is load current. On the other hand, collector current $i_c$ has a relation $i_c = \alpha i_e$, where $\alpha$ is the current amplification factor, and voltage $V_c$ at the collector terminal 2 can be expressed as $$V_c = V_{cc} - R_c i_c \quad (9)$$

Therefore, the collector to base voltage $V_{cb}$ is given by the equation $$V_{cb} = V_c - V_e = V_{cc} - V_b - R_c \cdot \alpha \cdot \left( i_L + \frac{V_b - V_{be} - V_E}{R_E} \right) \quad (10)$$

As will be apparent from the above equation, variation or fluctuation of parameters such as $V_{cc}$ and $V_b$ sometimes renders it difficult as a matter of practical use to maintain the value of $V_{cb}$ within a region of a certain width. If the conventional circuit configuration as shown in FIG. 8 is used intact in order to obtain stable performance which is more than enough to allow for any variation of parameters as described above, the extreme value of $V_{cb}$ in the forward biased direction in FIG. 9 exceeds the boundary $V_{cb\infty}$ to the saturatiton region and the transistor is forced to operate in the saturation region. In such a case, a difficulty arises that high speed performance peculiar to an emitter follower is completely lost due to the minority carrier storage effect. When conversely it is so arranged that the transistor may not operate in the saturation region beyond the boundary $V_{cb\infty}$ to the saturation region, a difficulty also arises that the value of $V_{cb}$ can not sufficiently be maintained in the neighborhood of the saturation region due to the above-described variation of parameters with the result that the performance becomes unstable.

In the circuit configuration according to the present invention, therefore, a compensating circuit as, for example, shown in FIG. 11 is provided which includes a diode $D_1$, resistors $R_1$ and $R_2$ in series with the diode $D_1$, and a transistor $T_{r1}$ whose base terminal is connected to the junction $B_1$ of the resistors $R_1$ and $R_2$, whose emitter terminal is connected to the collector terminal 2 of transistor $T_1$ of the emitter follower, and whose collector terminal is connected through a resistor $R_3$ to the collector voltage supply.

In the cutoff state of transistor $T_{r1}$, voltage at a terminal $B_2$ and voltage at the emitter terminal 3 are divided by the series circuit of the resistors $R_2$ and $R_1$ and the diode $D_1$ to appear at the junction $B_1$. In this case, the difference voltage $V_D$ between the junction $B_1$ and the emitter terminal 3 is substantially constant due to nonlinear resistance of the diode $D_1$ and is relatively difficulty affected by any variation of voltage $V_e$ at the emitter terminal 3 and variation of the resistors $R_1$ and $R_2$. When a pulse input as shown by a waveform *a* in FIG. 10 is impressed on the base input terminal 1, the voltage $V_c$ at the collector terminal 2 tends to fall as shown by a waveform *c* in FIG. 10 at the rise time portion of this input pulse. However, it is so arranged that any lowering of this voltage $V_c$ by an amount more than $V_{beo}$ below the voltage at the junction $B_1$ causes the transistor $T_{r1}$ to be driven from its cutoff region into its active region. Thus $V_{beo}$ takes a substantially constant value which is determined by the transistor $T_{r1}$.

This manner of circuit configuration is quite effective in that any tendency of lowering of voltage at the collector terminal 2 causes flow of emitter current $i_e'$ of the compensating transistor $T_{r1}$ into the collector terminal 2 to maintain the voltage $V_c$ at this terminal substantially constant relative to the emitter voltage $V_e$ of transistor $T_1$ of the emitter follower. Or more precisely, $V_c$ is obtained by an equation $$V_c = V_e + V_D - V_{beo} \quad (11)$$

and from this relation $$V_c - V_e = V_D - V_{beo}$$

Thus, $V_{ce} = V_c - V_e$ can be maintained substantially constant. In practical operation, base current is supplied from the junction $B_1$ when the transistor $T_{r1}$ is in its active region and as a result the value of $V_D$ is thereby varied. However, this problem can be solved by suitably determining the values of the resistors $R_1$ and $R_2$, the diode $D_1$ and other elements in a manner that any influence by the above-described base current becomes negligible. The resistor $R_1$ is provided in order to regulate the value of $V_D$ to a desired value, but this resistor may be replaced by a diode $D_2$ as shown in FIG. 12, or alternatively a a resistor $R_{c2}$ may be interposed in the flow path of collector current $i_c$ to adjust the value of $V_{cb}$ also as shown in FIG. 12. The resistor $R_3$ is inserted in order to stabilize the performance of the transistor $T_{r1}$, but no practical difficulty will be brought forth by eliminating the same. Although the above embodiment has referred to the case of the emitte follower employing the NPN transistor, it is apparent that an emitter follower employing a PNP transistor can attain an entirely similar effect by virtue of the complementary characteristics of both transistor types.

From the foregoing description, it will be understood that the desired object can easily be accomplished by arranging in a manner that difference between emitter and collector voltages of the emitter follower transistor which performs logical functions is first detected and, in order to avoid theabove difference from becoming excessively great beyond a desired value, the emitter to collector voltage of the transistor is maintained substantially constant at one end of the DC stationary region of operation of the transistor in its active region so that said end of the operating region of the transistor is set in the neighborhood of the boundary between the saturation region and the active region. Consider for example a case of an emitter follower in FIG. 7 constituted by a PNP transistor $T_1'$, a collector resistor $R_c'$ and an emitter resistor $R_E'$. In this case, transistors $T_2'$, $T_3'$, . . ., $T_m'$ in the same stage, and NPN transistors $T_1$, $T_2$, . . ., $T_m$ in the succeeding stage form the load of the transistor $T_1'$. This has a load component corresponding to the capacitive load component $C_L$ in FIG. 8 and therefore pulse response of this sort of emitter follower logic circuit is generally liable to become oscillatory. Such defect however can easily be eliminated by adding thereto a compensating circuit as described above. Especially when the emitter follower logic circuit using NPN transistors and the emitter follower logic circuit using PNP transistors simultaneously exist by being connected with each other in cascade fashion as shown in FIG. 7, the desired stabilization can most effectively be realized because the NPN emitter follower circuit has a stabilizing effect at a higher level of an input pulse signal while the PNP emitter follower circuit has a stabilizing effect at a lower level of the input pulse signal.

In the above-described circuit of the present invention, the collector to emitter voltage is made constant at one end of the operating region with respect to the pulse input, but since the emitter to base voltage is substantially constant as described above, the collector to base voltage can consequently be maintained at a substantially constant value. That is, $$V_c - V_b = V_{cb} = V_D - (V_{beo} + V_{be})$$

In case the emitters and collectors of a plurality of transistors are connected in common to respective common terminals as in the case of the emitter follower logic circuit of FIG. 7, there are a plurality of base input terminals and the emitter terminal is common to all of the emitters. It is accordingly apparent that the method according to the present invention in which the collector to emitter voltage is detected and compensation is applied to maintain this voltage constant is superior to a method in which the base to collector voltage is detected and compensation is applied to maintain this voltage constant. Needless to say, various modifications and changes may be made in the above-described embodiments in which the voltage difference between the collector and emitter is detected to control the collector to emitter voltage so as to set this voltage within some narrow range at one end of the operating region.

According to the inventive arrangement as described in detail in the foregoing, the collector to emitter voltage of a transistor is controlled to be nearly constant in a manner that the operating region of the transistor at one of two, high and low, input signal levels is set at the active region in the neighborhood of the boundary between the active region and the saturation region. Therefore, the circuit of the present invention can stably operate without being affected by variation of resistance, variation of power supply voltage, variation of load current, variation of input voltage level and other factors, and thus can allow for a great degree of freedom in respect of design. Further, a necessary degree of allowance for an AC noise can easily be provided since the collector junction capacitance becomes great at one end of the signal swing.

What we claim is:

1. A transistor logic switching circuit having a plurality of switching transistors whose emitters and collectors are connected in common with an operating voltage source through a common emitter resistor and a common collector resistor, respectively, so that said switching transistors are operated in their active or cutoff state depending on whether or not an input signal is applied to their bases, a compensating circuit comprising a compensating transistor having an emitter and collector connected in parallel circuit relationship with said common collector resistor to said operating voltage source, and means for maintaining the potential at the base of compensating transistor relative to the potential at said commonly connected emitters constant so that said compensating transistor is operated in its active state upon the potential at said commonly connected collectors becoming lower than said potential at the base of said compensating transistor, whereby the DC stationary region of any of said switching transistors in its active state is retained within its active region and in the neghborhood of the boundary between the saturation region and the active region.

2. A transistor logic switching circuit according to claim 1, further comprising a resistor connected between said commonly connected collectors and said emitter of said compensating transistor for adjusting the potential at said commonly connected collectors.

3. A transistor logic switching circuit according to claim 1, further comprising a resistor connected in series circuit relationship with the emitter-collector of said compensating transistor for stabilizing the operation thereof, the series circuit thus formed being connected in parallel circuit relationship with the common collector resistor.

References Cited

UNITED STATES PATENTS

| | | | |
|---|---|---|---|
| 2,964,652 | 12/1960 | Yourke | 307—216 |
| 3,259,761 | 7/1966 | Narud et al. | 307—215 |

DONALD D. FORRER, *Primary Examiner.*

U.S. Cl. X.R.

307—208, 215, 297